(12) United States Patent
Song et al.

(10) Patent No.: US 12,457,849 B2
(45) Date of Patent: Oct. 28, 2025

(54) DISPLAY DEVICE AND METHOD OF MANUFACTURING THE SAME

(71) Applicant: Samsung Display Co., LTD., Yongin-si (KR)

(72) Inventors: Si Joon Song, Suwon-si (KR); Youn Woong Kang, Cheonan-si (KR); Min Sang Koo, Seongnam-si (KR); Dong Hyun Lee, Asan-si (KR); Jae Hak Lee, Asan-si (KR); Jun Young Lee, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 512 days.

(21) Appl. No.: 18/079,767

(22) Filed: Dec. 12, 2022

(65) Prior Publication Data

US 2023/0189560 A1 Jun. 15, 2023

(30) Foreign Application Priority Data

Dec. 13, 2021 (KR) ........................ 10-2021-0177707

(51) Int. Cl.
*H10K 50/86* (2023.01)
*H05K 1/11* (2006.01)
(Continued)

(52) U.S. Cl.
CPC ........... *H10K 50/865* (2023.02); *H05K 1/111* (2013.01); *H05K 1/147* (2013.01);
(Continued)

(58) Field of Classification Search
None
See application file for complete search history.

(56) References Cited

U.S. PATENT DOCUMENTS

2010/0065850 A1* 3/2010 Kwak ............... G02F 1/136227
257/72
2011/0050612 A1* 3/2011 Matsumoto ......... G06F 3/04164
345/173

(Continued)

FOREIGN PATENT DOCUMENTS

JP 5226630 B2 7/2013
KR 20200041854 A * 4/2020
(Continued)

*Primary Examiner* — Ryan Crockett
(74) *Attorney, Agent, or Firm* — Womble Bond Dickinson (US) LLP

(57) ABSTRACT

A display device has a display area with a plurality of light emitting areas and a non-light emitting area between the light emitting areas and a non-display area around a periphery of the display area. The display device includes: a base substrate having a first surface and an opposite second surface; a light emitting element in each of the light emitting areas on the first surface; a light blocking pattern in the non-light emitting area and in a light blocking area of the non-display area; a printed circuit film attached to a pad area of the non-display area on the first surface; and a light blocking layer on the light blocking pattern and the printed circuit film. The pad area is nearer to an end of the base substrate than the light blocking area is, and the light blocking layer includes a black resin and overlaps the light blocking pattern.

20 Claims, 13 Drawing Sheets

(51) Int. Cl.
*H05K 1/14* (2006.01)
*H10F 39/00* (2025.01)
*H10K 50/842* (2023.01)
*H10K 59/122* (2023.01)
*H10K 71/00* (2023.01)

(52) U.S. Cl.
CPC ...... *H10F 39/8053* (2025.01); *H10K 50/8426* (2023.02); *H10K 59/122* (2023.02); *H10K 71/821* (2023.02)

(56) References Cited

U.S. PATENT DOCUMENTS

| | | | | |
|---|---|---|---|---|
| 2014/0176832 | A1* | 6/2014 | Imazeki | G06F 3/0443 |
| | | | | 349/12 |
| 2016/0016396 | A1* | 1/2016 | Kikuchi | G02F 1/133308 |
| | | | | 156/64 |
| 2018/0045994 | A1* | 2/2018 | Kwon | G02F 1/13439 |
| 2018/0145125 | A1* | 5/2018 | Lee | H10K 77/111 |
| 2020/0152707 | A1* | 5/2020 | Won | H10K 59/131 |
| 2020/0358013 | A1* | 11/2020 | Zhou | G06F 1/1656 |
| 2021/0216107 | A1* | 7/2021 | Lee | H05K 1/0259 |
| 2023/0014374 | A1* | 1/2023 | Lee | H01L 25/0753 |
| 2023/0058776 | A1* | 2/2023 | Lee | H01L 21/568 |

FOREIGN PATENT DOCUMENTS

| | | | |
|---|---|---|---|
| KR | 10-2135937 | B1 | 7/2020 |
| KR | 10-2023-0013657 | A | 1/2023 |
| KR | 10-2023-0028670 | A | 3/2023 |

* cited by examiner

DISPLAY DEVICE AND METHOD OF MANUFACTURING THE SAME

CROSS-REFERENCE TO RELATED APPLICATION

This application claims priority to and the benefit of Korean Patent Application No. 10-2021-0177707, filed on Dec. 13, 2021, in the Korean Intellectual Property Office, the disclosure of which is incorporated herein in its entirety by reference.

BACKGROUND

1. Field

Aspects of embodiments of the present disclosure relate to a display device and a method of manufacturing the same.

2. Description of the Related Art

As the information society develops, demand for display devices for displaying images in various forms is increasing. For example, display devices are being applied to various electronic devices, such as smartphones, digital cameras, notebook computers, navigation devices, and smart televisions. The display devices may be flat panel display devices, such as liquid crystal display devices, field emission display devices, and organic light emitting diode display devices. From among these flat panel display devices, a light emitting display device includes a light emitting element that enables each pixel of a display panel to emit light by itself (e.g., includes self-emissive pixels). Thus, the light emitting display device can display an image without a backlight unit that provides light to the display panel.

SUMMARY

Embodiments of the present disclosure provide a display device that exhibits reduced visibility of a step difference in a pad area.

Embodiments of the present disclosure also provide a method of manufacturing a display device exhibiting reduced visibility of a step difference in a pad area.

However, aspects and features of the present disclosure are not restricted to those explicitly set forth herein. The above and other aspects and features of the present disclosure will become more apparent to one of ordinary skill in the art to which the present disclosure pertains by referencing the detailed description of the present disclosure given below.

According to an embodiment of the present disclosure, a display device has a display area with a plurality of light emitting areas and a non-light emitting area between the light emitting areas and a non-display area around a periphery of the display area. The display device includes: a base substrate having a first surface and a second surface opposite the first surface; a light emitting element in each of the light emitting areas on the first surface of the base substrate; a light blocking pattern in the non-light emitting area on the light emitting element and in a light blocking area of the non-display area; a printed circuit film attached to a pad area of the non-display area on the first surface of the base substrate; and a light blocking layer on the light blocking pattern and the printed circuit film. The pad area is nearer to an end of the base substrate than the light blocking area is, and the light blocking layer includes a black resin and overlaps the light blocking pattern.

According to another embodiment of the present disclosure, a display device has a display area with a plurality of light emitting areas and a non-light emitting area between the light emitting areas and a non-display area around a periphery of the display area. The display device includes: a base substrate having a first surface and a second surface opposite the first surface; a light emitting element in each of the light emitting areas on the first surface of the base substrate; a light blocking pattern in the non-light emitting area on the light emitting element and in a light blocking area of the non-display area; a printed circuit film attached to a pad area of the non-display area on the first surface of the base substrate; a resin layer on the light blocking pattern and the printed circuit film; and a light blocking layer on the resin layer. The pad area is nearer to an end of the base substrate than the light blocking area is, and the light blocking layer overlaps the light blocking pattern.

According to another embodiment of the present disclosure, a method of manufacturing a display device is provided. The display device has a display area with a plurality of light emitting areas and a non-light emitting area between the light emitting areas and a non-display area around a periphery of the display area. The method includes: forming a light emitting element in each of the light emitting areas on a first surface of a base substrate; forming a light blocking pattern in the non-light emitting area on the light emitting element and in a light blocking area of the non-display area; attaching a printed circuit film to a pad area of the non-display area on the first surface of the base substrate; and forming a light blocking layer and an external light reflection preventing layer on the light blocking pattern and the printed circuit film. The pad area is nearer to an end of the base substrate than the light blocking area is. The light blocking layer is between the printed circuit film and the external light reflection preventing layer, includes a black resin, and overlaps the light blocking pattern.

BRIEF DESCRIPTION OF THE DRAWINGS

These and/or other aspects and features of the present disclosure will become apparent and more readily appreciated from the following description of the embodiments, taken in conjunction with the accompanying drawings, in which.

DETAILED DESCRIPTION

Figure 1:
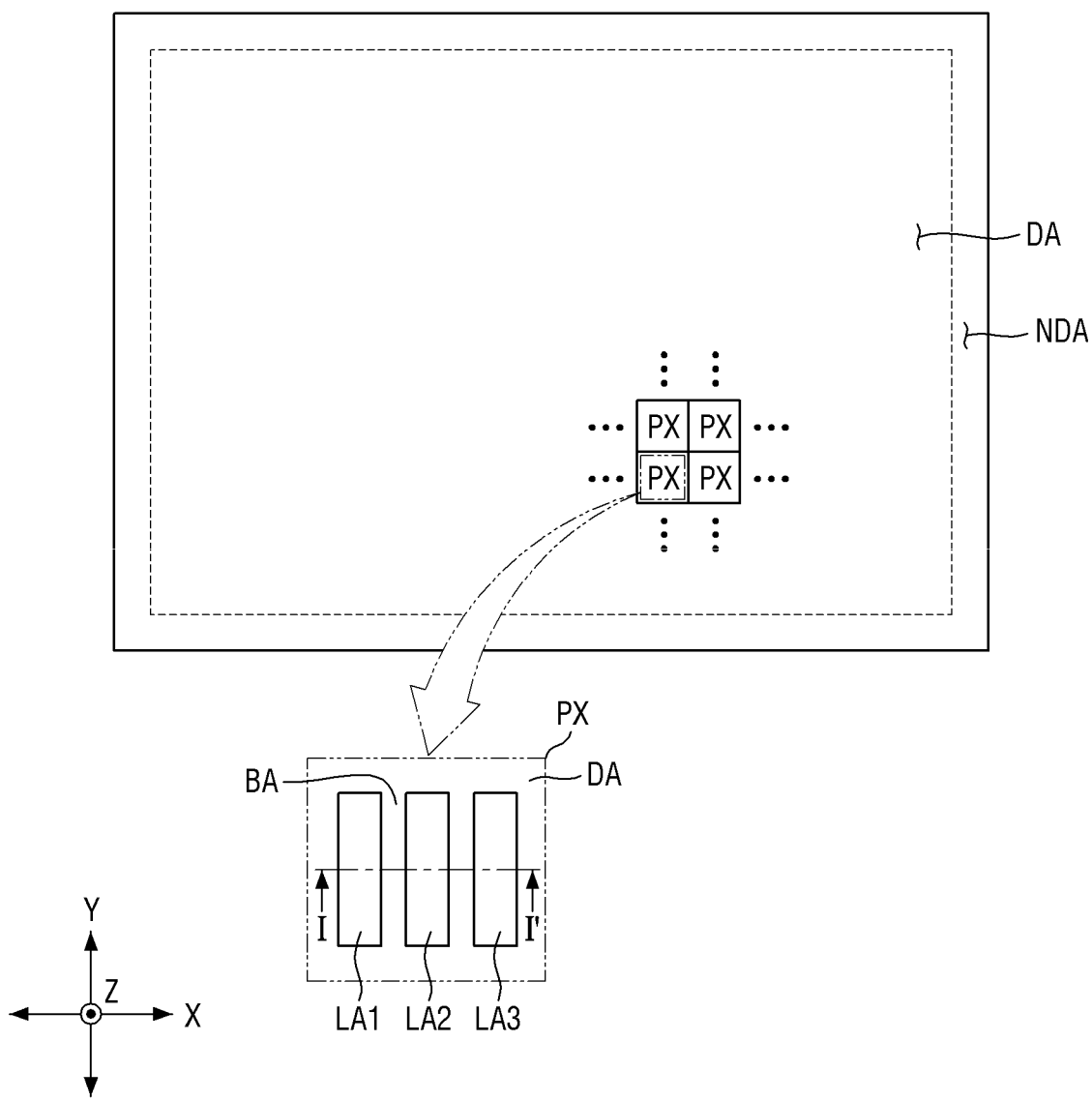
FIG. 1 is a plan view of a display device according to an embodiment.

Specific structural and functional descriptions of elements of embodiments of the present disclosure are presented herein for illustrative purposes. The present disclosure may be embodied in many different forms without departing from the spirit and scope of the present disclosure. Therefore, embodiments disclosed herein are for illustrative purposes and should not be construed as limiting the present disclosure. The present disclosure is defined by the scope of the claims, including their equivalents.

It will be understood that when an element is referred to as being related to another element such as being "coupled" or "connected" to another element, it can be directly coupled or connected to the other element or intervening elements may be present therebetween. It should be understood that when an element is referred to as being related to another element, such as being "directly coupled" or "directly connected" to another element, there are no intervening elements present. Other expressions that describe a relationship between elements, such as "between," "directly between," "adjacent to," or "directly adjacent to," should be construed in the same way.

Throughout the specification, the same reference numerals will refer to the same or like parts.

It will be understood that, although the terms "first," "second," "third," etc. may be used herein to describe various elements, components, regions, layers, and/or sections, these elements, components, regions, layers and/or sections should not be limited by these terms. These terms are only used to distinguish one element, component, region, layer, or section from another element, component, region, layer, or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "has," "having," "comprises," "comprising," "includes," "including," and variations thereof, when used in this specification, specify the presence of stated features, regions, integers, steps, operations, elements, and/or components but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. Thus, the term "lower," as one example, can encompasses both an orientation of "lower" and "upper," depending on the particular orientation of the figure. Similarly, if the device in one of the figures is turned over, elements described as "below" or "beneath" other elements would then be oriented "above" the other elements. Thus, the terms "below" or "beneath," as an example, can encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (e.g., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the present disclosure will be described with reference to the attached drawings.

FIG. 1 is a plan view of a display device according to an embodiment.

Referring to FIG. 1, the display device may include a display area DA and a non-display area NDA. The display area DA may include a plurality of pixels PX to display an image. The pixels PX may be arranged in a matrix manner. The non-display area NDA may be disposed around the display area DA to surround (e.g., to extend around a periphery) the display area DA and may not display an image. The non-display area NDA may completely surround the display area DA in a plan view.

Each of the pixels PX of the display device may include light emitting areas LA1 through LA3 defined by a pixel defining layer and may emit light having a peak wavelength (e.g., a predetermined peak wavelength) at the light emitting areas LA1 through LA3. For example, the display area DA of the display device may include first through third light emitting areas LA1 through LA3. Each of the light emitting areas LA1 through LA3 may be an area where light generated by a light emitting element of the display device is emitted to the outside of the display device.

Each of the first through third light emitting areas LA1 through LA3 may emit light having a peak wavelength to the outside of the display device. The first light emitting area LA1 may emit light of a first color, the second light emitting area LA2 may emit light of a second color, and the third light emitting area LA3 may emit light of a third color. For example, the light of the first color may be red light having a peak wavelength in a range of about 610 nm to about 650 nm, the light of the second color may be green light having a peak wavelength in a range of about 510 nm to about 550 nm, and the light of the third color may be blue light having a peak wavelength in a range of about 440 nm to about 480 nm. However, the present disclosure is not limited thereto.

The display area DA of the display device may include an inter-light emitting area light blocking area BA located between adjacent light emitting areas LA1 through LA3. For example, the inter-light emitting area light blocking area BA may be disposed between the first light emitting area LA1 and the second light emitting area LA2 and between the second light emitting area LA2 and the third light emitting area LA3.

Figure 2:
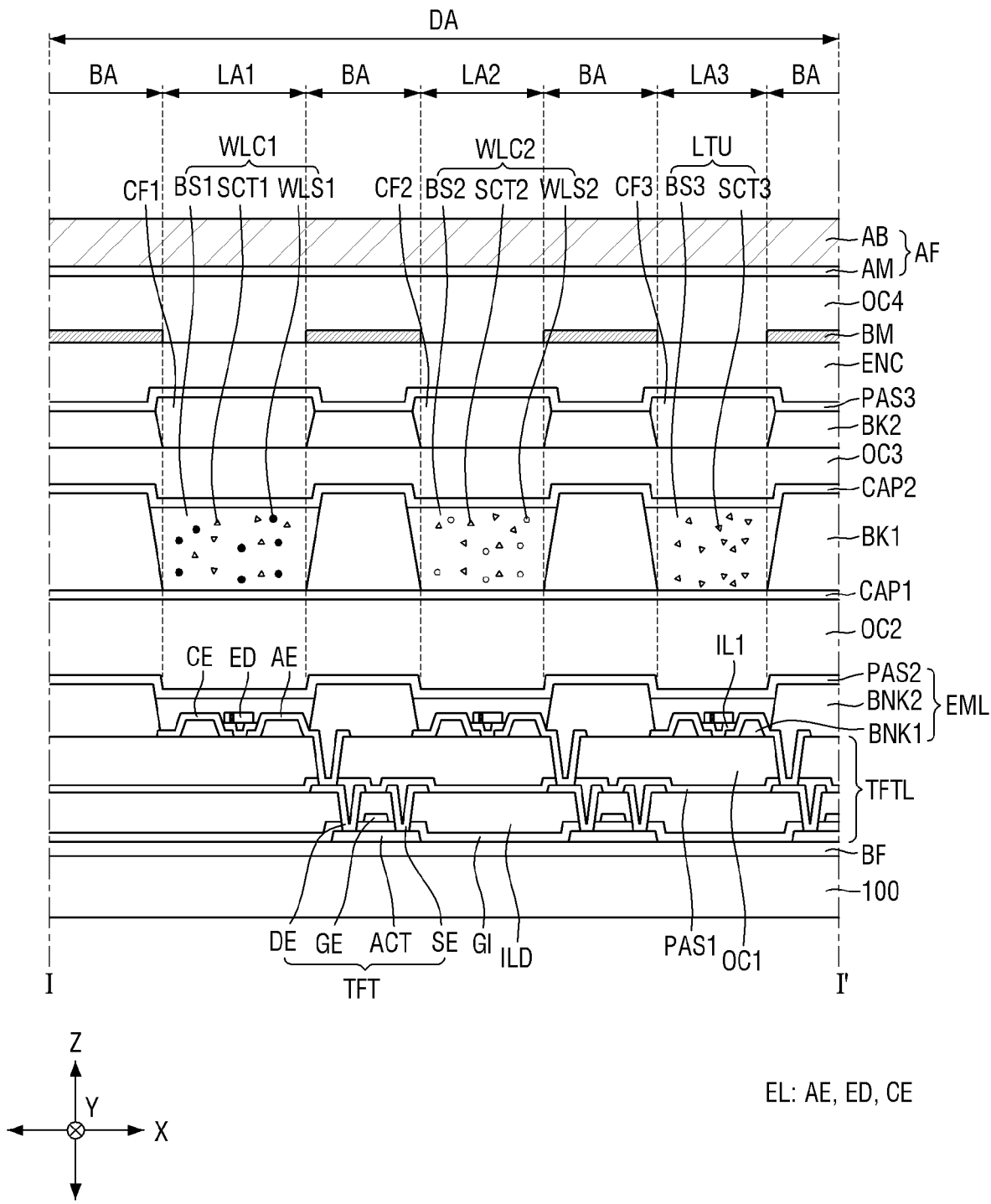
FIG. 2 is a cross-sectional view taken along the line I-I' of FIG. 1.

FIG. 2 is an enlarged cross-sectional view taken along the line I-I' of FIG. 1.

Referring to FIG. 2, the display area DA may have the first through third light emitting areas LA1 through LA3. Each of the first through third light emitting areas LA1 through LA3 may be an area where light generated by a light emitting element of the display device is emitted to the outside of the display device.

The display device may include a substrate 100, a buffer layer BF, a thin-film transistor layer TFTL, and a light emitting element layer EML.

The substrate 100 may be a base substrate or a base member and may be made of an insulating material, such as polymer resin. For example, the substrate 100 may be a rigid substrate.

The buffer layer BF may be disposed on the substrate 100. The buffer layer BF may be made of an inorganic layer that can prevent penetration of air or moisture.

The thin-film transistor layer TFTL may include thin-film transistors TFT, a gate insulating layer GI, an interlayer insulating film ILD, a first passivation layer PAS1, and a first planarization layer OC1.

Figure 3:
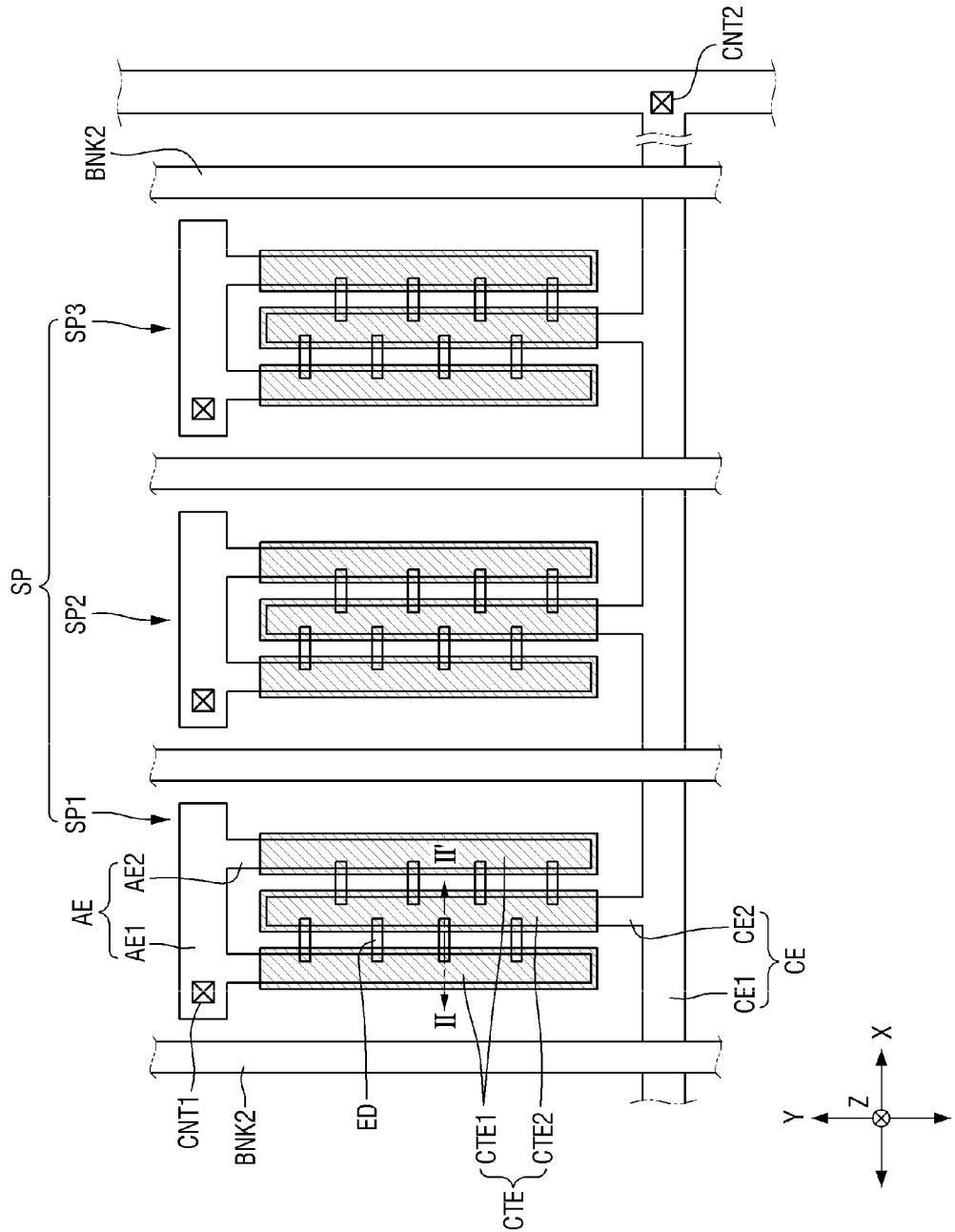
FIG. 3 is a plan view of a pixel of the display device according to an embodiment.

The thin-film transistors TFT may be disposed on the buffer layer BF and may constitute a pixel circuit for each of the pixels. Each of the thin-film transistors TFT may include a semiconductor layer ACT, a gate electrode GE, a source electrode SE, and a drain electrode DE, which will be described later. Further, an area in which each thin-film transistor TFT including the active layer ACT, the gate electrode GE, the source electrode SE and the drain electrode DE is disposed will be referred to as a thin-film transistor area as illustrated in FIG. 3.

The semiconductor layer ACT may be provided on the buffer layer BF. The gate electrode GE, the source electrode SE, and the drain electrode DE may overlap the semiconductor layer ACT. The semiconductor layer ACT may directly contact the source electrode SE and the drain electrode DE and may face the gate electrode GE with the gate insulating layer GI interposed between them.

The gate electrode GE may be disposed on the gate insulating layer GI. The gate electrode GE may overlap the semiconductor layer ACT with the gate insulating layer GI interposed between them.

The source electrode SE and the drain electrode DE may be spaced apart from each other on the interlayer insulating film ILD. The source electrode SE may contact an end of the semiconductor layer ACT through a contact hole (e.g., a contact opening) provided in the gate insulating layer GI and the interlayer insulating film ILD. The drain electrode DE may contact the other end of the semiconductor layer ACT through a contact hole (e.g., a contact opening) provided in the gate insulating layer GI and the interlayer insulating film ILD. The drain electrode DE may be connected to a first electrode AE of each light emitting member EL through a contact hole (e.g., a contact opening) provided in the first passivation layer PAS1 and the first planarization layer OC1.

The thin-film transistor area TFTA described above may substantially overlap the light blocking area BA in a thickness direction.

The gate insulating layer GI may be provided on the semiconductor layers ACT. For example, the gate insulating layer GI may be disposed on the semiconductor layers ACT and the buffer layer BF and may insulate the semiconductor layers ACT from the gate electrodes GE. The gate insulating layer GI may have contact holes (e.g., contact openings) through which the source electrodes SE pass and contact holes (e.g., contact openings) through which the drain electrodes DE pass.

The interlayer insulating film ILD may be disposed on the gate electrodes GE. For example, the interlayer insulating film ILD may include contact holes (e.g., contact openings) through which the source electrodes SE pass and contact holes (e.g., contact openings) through which the drain electrodes DE pass.

The first passivation layer PAS1 may be provided on the thin-film transistors TFT to protect the thin-film transistors TFT. For example, the first passivation layer PAS1 may have contact holes (e.g., contact openings) through which the first electrodes AE pass (e.g., extend).

The first planarization layer OC1 may be provided on the first passivation layer PAS1 to planarize the top of each of the thin-film transistors TFT. For example, the first planarization layer OC1 may have contact holes (e.g., contact openings) through which the first electrodes AE of the light emitting members EL pass.

The light emitting element layer EML may include the light emitting members EL, first banks BNK1, second banks BNK2, and a second passivation layer PAS2.

The light emitting members EL may be provided on the thin-film transistors TFT. Each of the light emitting members EL may include the first electrode AE, a second electrode CE, and a light emitting element ED.

The first electrode AE may be provided on the first planarization layer OC1. For example, the first electrode AE may be disposed on a first bank BNK1, which is disposed on the first planarization layer OC1, to cover the first bank BNK1. The first electrode AE may overlap one of the first through third light emitting areas LA1 through LA3, which are defined by the second banks BNK2. In addition, the first electrode AE may be connected to the drain electrode DE of each thin-film transistor TFT.

The second electrode CE may be provided on the first planarization layer OC1. For example, the second electrode CE may be disposed on a first bank BNK1, which is disposed on the first planarization layer OC1, to cover the first bank BNK1. The second electrode CE may overlap one of the first through third light emitting areas LA1 through LA3. which are defined by the second banks BNK2. For example, the second electrode CE may receive a common voltage supplied to all pixels.

A first insulating layer IL1 may cover a part of the first electrode AE and a part of the second electrode CE that are adjacent to each other and may insulate the first electrode AE from the second electrode CE.

The light emitting element ED may be disposed above the first planarization layer OC1 between the first electrode AE and the second electrode CE. The light emitting element ED may be disposed on the first insulating layer IL1. An end of the light emitting element ED may be connected to the first electrode AE, and another end (e.g., an opposite end) of the light emitting element ED may be connected to the second electrode CE. For example, a plurality of light emitting elements ED may include active layers having the same material to emit light of the same wavelength band or light of the same color. Thus, in some embodiments, light emitted from the first through third light emitting areas LA1 through LA3 may have the same color. For example, the light emitting elements ED may emit light of the third color or blue light having a peak wavelength in a range of about 440 to about 480 nm.

The second banks BNK2 may be disposed on the first planarization layer OC1 to define the first through third light emitting areas LA1 through LA3. For example, the second banks BNK2 may surround (e.g., may surround in a plan view or may extend around a periphery of) each of the first through third light emitting areas LA1 through LA3, but the present disclosure is not limited thereto. The second banks BNK2 may be disposed in the light blocking area BA.

The second passivation layer PAS2 may be disposed on the light emitting members EL and the second banks BNK2. The second passivation layer PAS2 may cover the light emitting members EL and protect the light emitting members EL.

The display device may further include a second planarization layer OC2, a first capping layer CAP1, first light blocking members BK1, a first wavelength conversion part WLC1, a second wavelength conversion part WLC2, a light transmission part LTU, a second capping layer CAP2, a third planarization layer OC3, second light blocking members BK2, first through third color filters CF1 through CF3, a third passivation layer PAS3, and an encapsulation layer ENC.

The second planarization layer OC2 may be provided on the light emitting element layer EML to planarize the top of the light emitting element layer EML. The second planarization layer OC2 may include an organic material.

The first capping layer CAP1 may be disposed on the second planarization layer OC2. The first capping layer CAP1 may seal lower surfaces of the first and second wavelength conversion parts WLC1 and WLC2 and the light transmission part LTU. The first capping layer CAP1 may include an inorganic material.

The first light blocking members BK1 may be disposed on the first capping layer CAP1 in the light blocking area BA. The first light blocking members BK1 may overlap the second banks BNK2 in the thickness (e.g., the z-axis) direction. The first light blocking members BK1 may block (or substantially block) transmission of light.

The first light blocking members BK1 may include an organic light blocking material and a liquid repellent (e.g., a hydrophobic) component.

The first light blocking members BK1 including a liquid repellent component may separate the first and second wavelength conversion parts WLC1 and WLC2 and the light transmission part LTU into corresponding light emitting areas LA.

The first wavelength conversion part WLC1 may be disposed on the first capping layer CAP1 in the first light emitting area LA1. The first wavelength conversion part WLC1 may be surrounded by (e.g., may be surrounded by in a plan view) the first light blocking members BK1. The first wavelength conversion part WLC1 may include a first base resin BS1, first scatterers SCT1, and first wavelength shifters WLS1.

The first base resin BS1 may include a material having a relatively high light transmittance. The first base resin BS1 may be made of a transparent organic material. For example, the first base resin BS1 may include at least one of organic materials, such as epoxy resin, acrylic resin, cardo resin, and imide resin.

The first scatterers SCT1 may have a refractive index different from that of the first base resin BS1 and may form an optical interface with the first base resin BS1.

The first wavelength shifters WLS1 may convert (or shift) the peak wavelength of incident light into a first peak wavelength. For example, the first wavelength shifters WLS1 may convert blue light provided by the display device into red light having a single peak wavelength in a range of about 610 nm to about 650 nm and emit the red light. The first wavelength shifters WLS1 may be quantum dots, quantum rods, or phosphors. The quantum dots may be particulate materials that emit light of a specific color when electrons transition from a conduction band to a valence band.

Light emitted from the first wavelength shifters WLS1 may have a full width of half maximum (FWHM) of an emission wavelength spectrum in a range of about 45 nm or less, 40 nm or less, or 30 nm or less. Therefore, the color purity and color reproducibility of the display device can be further improved.

A part of blue light provided by the light emitting element layer EML may be transmitted through the first wavelength conversion part WLC1 without being converted into red light by the first wavelength shifters WLS1. Of the blue light provided by the light emitting element layer EML, light incident on the first color filter CF1 without being converted by the first wavelength conversion part WLC1 may be blocked by the first color filter CF1. In addition, red light into which the blue light provided by the display device has been converted by the first wavelength conversion part WLC1 may be emitted to the outside through the first color filter CF1. Therefore, the first light emitting area LA1 may emit red light.

The second wavelength conversion part WLC2 may be disposed on the first capping layer CAP1 in the second light emitting area LA2. The second wavelength conversion part WLC2 may be surrounded by (e.g., may be surrounded in a plan view) the first light blocking members BK1. The second wavelength conversion part WLC2 may include a second base resin BS2, second scatterers SCT2, and second wavelength shifters WLS2.

The second base resin BS2 may include a material having a relatively high light transmittance. The second base resin BS2 may be made of a transparent organic material.

The second scatterers SCT2 may have a refractive index different from that of the second base resin BS2 and may form an optical interface with the second base resin BS2. For example, the second scatterers SCT2 may include a light scattering material or light scattering particles that scatter at least a part of transmitted light.

The second wavelength shifters WLS2 may convert (or shift) the peak wavelength of incident light into a second peak wavelength different from the first peak wavelength of the first wavelength shifters WLS1. For example, the second wavelength shifters WLS2 may convert blue light provided by the display device into green light having a single peak wavelength in a range of about 510 nm to about 550 nm and emit the green light. The second wavelength shifters WLS2 may be quantum dots, quantum rods, or phosphors. The second wavelength shifters WLS2 may include a material having the same purpose as the materials described in the description of the first wavelength shifters WLS1.

The light transmission part LTU may be disposed on the first capping layer CAP1 in the third light emitting area LA3. The light transmission part LTU may be surrounded by (e.g., may be surrounded in a plan view) the first light blocking members BK1. The light transmission part LTU may transmit incident light while maintaining (e.g., without changing or substantially changing) the peak wavelength of the incident light. The light transmission part LTU may include a third base resin BS3 and third scatterers SCT3.

The third base resin BS3 may include a material having a relatively high light transmittance. The third base resin BS3 may be made of a transparent organic material.

The third scatterers SCT3 may have a refractive index different from that of the third base resin BS3 and may form an optical interface with the third base resin BS3. For example, the third scatterers SCT3 may include a light scattering material or light scattering particles that scatter at least a part of transmitted light.

Because the first and second wavelength conversion parts WLC1 and WLC2 and the light transmission part LTU are disposed on the light emitting element layer EML through the second planarization layer OC2 and the first capping layer CAP1, a separate substrate for the first and second wavelength conversion parts WLC1 and WLC2 and the light transmission part LTU may be omitted.

The second capping layer CAP2 may cover the first and second wavelength conversion parts WLC1 and WLC2, the light transmission part LTU, and the first light blocking members BK1.

The third planarization layer OC3 may be disposed on the second capping layer CAP2 to planarize the top of each of the first and second wavelength conversion parts WLC1 and WLC2 and the light transmission part LTU. The third planarization layer OC3 may include an organic material.

The second light blocking members BK2 may be disposed on the third planarization layer OC3 in the light blocking area BA. The second light blocking members BK2 may overlap the first light blocking members BK1 or the second banks BNK2 in the thickness direction. The second light blocking members BK2 may block (or substantially block) transmission of light.

The first color filter CF1 may be disposed on the third planarization layer OC3 in the first light emitting area LA1. The first color filter CF1 may be surrounded by (e.g., may be surrounded by in a plan view) the second light blocking members BK2. The first color filter CF1 may overlap the first wavelength conversion part WLC1 in the thickness direction. The first color filter CF1 may selectively transmit light of the first color (e.g., red light) and block or absorb light of the second color (e.g., green light) and light of the third color (e.g., blue light).

The second color filter CF2 may be disposed on the third planarization layer OC3 in the second light emitting area LA2. The second color filter CF2 may be surrounded by (e.g., may be surrounded by in a plan view) the second light blocking members BK2. The second color filter CF2 may overlap the second wavelength conversion part WLC2 in the thickness direction. The second color filter CF2 may selectively transmit light of the second color (e.g., green light) and block or absorb light of the first color (e.g., red light) and light of the third color (e.g., blue light).

The third color filter CF3 may be disposed on the third planarization layer OC3 in the third light emitting area LA3. The third color filter CF3 may be surrounded by (e.g., may be surrounded by in a plan view) the second light blocking members BK2. The third color filter CF3 may overlap the light transmission part LTU in the thickness direction. The third color filter CF3 may selectively transmit light of the third color (e.g., blue light) and block or absorb light of the first color (e.g., red light) and light of the second color (e.g., green light).

The first through third color filters CF1 through CF3 may absorb some of the light coming from the outside of the display device (e.g., some of the external light incident on the display device), thereby reducing reflected light due to the external light. Therefore, the first through third color filters CF1 through CF3 may prevent color distortion due to reflection of external light.

The third passivation layer PAS3 may cover the first through third color filters CF1 through CF3. The third passivation layer PAS3 may protect the first through third color filters CF1 through CF3.

The encapsulation layer ENC may be disposed on the third passivation layer PAS3. For example, the encapsulation layer ENC may include at least one inorganic layer to prevent penetration of oxygen or moisture. In addition, the encapsulation layer ENC may include at least one organic layer to protect the display device from foreign substances, such as dust.

The display device may further include light blocking patterns BM, a fourth planarization layer OC4, and an anti-reflection film AF. The light blocking patterns BM may be disposed on the encapsulation layer ENC in the inter-light emitting area (e.g., the light blocking area) BA. The light blocking patterns BM may include a light blocking material. For example, the light blocking patterns BM may include, but are not limited to, a black matrix-based material.

The fourth planarization layer OC4 may be disposed on the light blocking patterns BM and the encapsulation layer ENC. The fourth planarization layer OC4 may be disposed on the light blocking patterns BM and the encapsulation layer ENC to planarize the top of each of the light blocking patterns BM and the encapsulation layer ENC. The fourth planarization layer OC4 may include an organic material.

The anti-reflection film AF may be disposed on the fourth planarization layer OC4. The anti-reflection film AF may reduce reflection of external light. The anti-reflection film AF may include a first base AB and a first bonding layer AM disposed between the fourth planarization layer OC4 and the first base AB. The first bonding layer AM may attach the first base AB to the fourth planarization layer OC4.

FIG. 3 is a plan view of a pixel of the display device according to an embodiment.

Referring to FIG. 3, each of a plurality of pixels may include first through third subpixels. The first through third subpixels may correspond to the first through third light emitting areas LA1 through LA3, respectively. The light emitting elements ED of the first through third subpixels may emit light through the first through third light emitting areas LA1 through LA3, respectively.

The first through third subpixels may emit light of the same color. For example, the first through third subpixels may include the same type of light emitting elements ED and may emit light of the third color (or blue light). As another example, the first subpixel may emit light of the first color or red light, the second subpixel may emit light of the second color or green light, and the third subpixel may emit light of the third color or blue light.

Each of the first through third subpixels may include the first and second electrodes AE and CE, the light emitting elements ED, a plurality of contact electrodes CTE, and the second banks BNK2.

The first and second electrodes AE and CE may be electrically connected to the light emitting elements ED to receive a voltage (e.g., a predetermined voltage), and the light emitting elements ED may emit light of a specific wavelength band. At least a part of each of the first and second electrodes AE and CE may form an electric field in the pixel, and the light emitting elements ED may be aligned by the electric field.

For example, the first electrode AE may be a pixel electrode that is separate for (e.g., is separately formed for) each of the first through third subpixels, and the second electrode CE may be a common electrode connected in common to the first through third subpixels. Any one of the first electrode AE and the second electrode CE may be an anode of each light emitting element ED, and the other may be a cathode of each light emitting element ED.

The first electrode AE may include a first electrode stem part AE1 extending in a first direction (e.g., the X-axis direction) and one or more first electrode branch parts AE2 branching from the first electrode stem part AE1 and extending in a second direction (e.g., the Y-axis direction).

The first electrode stem part AE1 of each of the first through third subpixels may be spaced apart from the first electrode stem parts AE1 of adjacent subpixels and may be disposed on an imaginary extension line with the first electrode stem parts AE1 of the subpixels adjacent in the first direction X. The respective first electrode stem parts AE1 of the first through third subpixels may receive different signals and may be driven independently.

The first electrode branch parts AE2 may branch from the first electrode stem part AE1 to extend in the second direction Y. An end of each first electrode branch part AE2 may be connected to the first electrode stem part AE1, and the other end of each first electrode branch part AE2 may be spaced apart from a second electrode stem part CE1 facing the first electrode stem part AE1.

The second electrode CE may include the second electrode stem part CE1 extending in the first direction X and a second electrode branch part CE2 branching from the second electrode stem part CE1 and extending in the second direction Y. The second electrode stem part CE1 of each of the first through third subpixels may be connected to the second electrode stem parts CE1 of adjacent subpixels. The second electrode stem part CE1 may extend in the first direction X across a plurality of pixels. The second electrode stem part CE1 may be connected to the periphery of the display area DA or a part extending in a direction in the non-display area NDA.

The second electrode branch part CE2 may be spaced apart from the first electrode branch parts AE2 to face them. An end of the second electrode branch part CE2 may be connected to the second electrode stem part CE1, and the other end of the second electrode branch part CE2 may be spaced apart from the first electrode stem part AE1.

The first electrode AE may be electrically connected to the thin-film transistor layer TFTL of the display device through a first contact hole (e.g., a first contact opening) CNT1, and the second electrode CE may be electrically connected to the thin-film transistor layer TFTL of the display device through a second contact hole (e.g., a second contact opening) CNT2. For example, the first contact hole CNT1 may be disposed in each of the first electrode stem parts AE1, and the second contact hole CNT2 may be disposed in the second electrode stem part CE1, but the present disclosure is not limited thereto.

The second banks BNK2 may be disposed at boundaries between a plurality of pixels. A plurality of first electrode stem parts AE1 may be spaced apart from each other by the second banks BNK2. The second banks BNK2 may extend in the second direction Y and may be disposed at the boundaries of pixels SP arranged in the first direction X. Additionally, the second banks BNK2 may be disposed at the boundaries of pixels SP arranged in the second direction Y. The second banks BNK2 may define the boundaries of the pixels.

The second banks BNK2 may prevent ink from crossing the boundaries of adjacent pixels SP when the ink in which the light emitting elements ED are dispersed is sprayed during the manufacture of the display device. The second banks BNK2 may separate inks in which different light emitting elements ED are dispersed so that the inks are not mixed with each other.

The light emitting elements ED may be disposed between the first electrode AE and the second electrode CE. An end of each of the light emitting elements ED may be connected to the first electrode AE, and the other end of each of the light emitting elements ED may be connected to the second electrode CE.

The light emitting elements ED may be spaced apart from each other and may be aligned substantially parallel to each other. A gap between the light emitting elements ED is not particularly limited.

The light emitting elements ED may include active layers having the same material to emit light of the same wavelength band or light of the same color. The first through third subpixels may emit light of the same color. For example, the light emitting elements ED may emit light of the third color or blue light having a peak wavelength in a range of about 440 nm to about 480 nm.

The contact electrodes CTE may include first and second contact electrodes CTE1 and CTE2. The first contact electrodes CTE1 may cover the first electrode branch parts AE2, and a part of each light emitting element ED and may electrically connect the first electrode branch parts AE2 and the light emitting elements ED. The second contact electrode CTE2 may cover the second electrode branch part CE2, and another part of each light emitting element ED and may electrically connect the second electrode branch part CE2 and the light emitting elements ED.

The first contact electrodes CTE1 may be disposed on the first electrode branch parts AE2 to extend in the second direction Y. The first contact electrodes CTE1 may contact an end of each light emitting element ED. The light emitting elements ED may be electrically connected to the first electrode AE through the first contact electrodes CTE1.

The second contact electrode CTE2 may be disposed on the second electrode branch part CE2 to extend in the second direction Y. The second contact electrode CTE2 may be spaced apart from the first contact electrodes CTE1 in the first direction X. The second contact electrode CTE2 may contact the other end of each light emitting element ED. The light emitting elements ED may be electrically connected to the second electrode CE through the second contact electrode CTE2.

Figure 4:
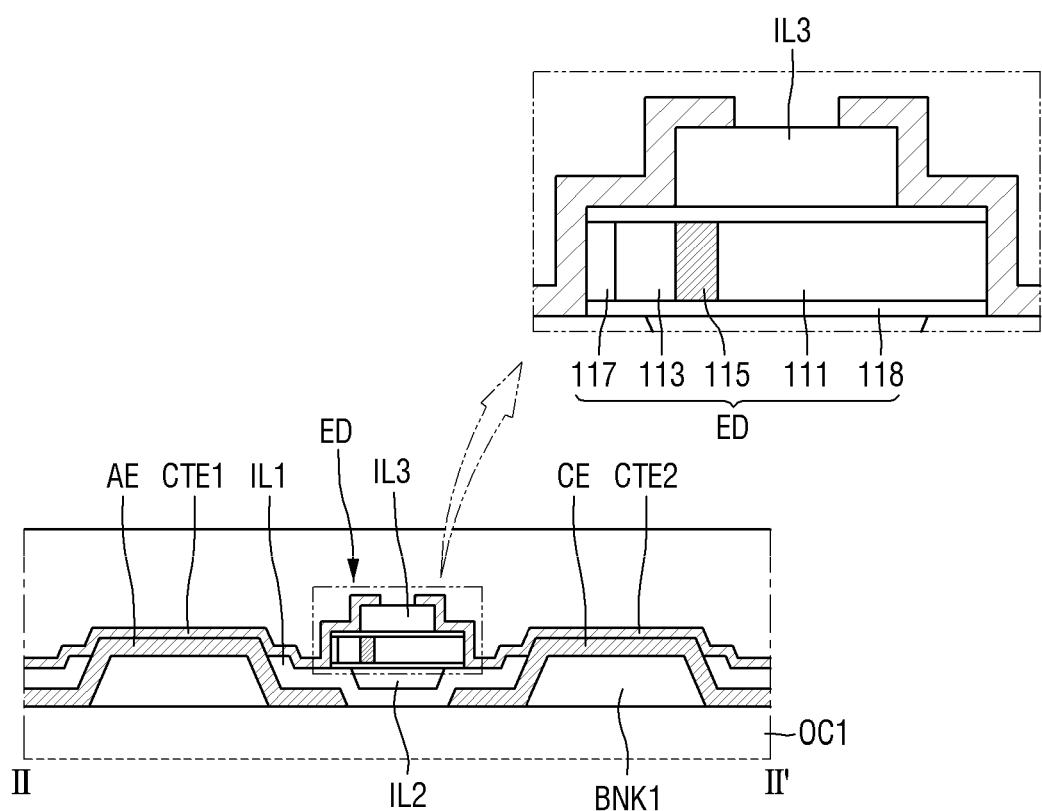
FIG. 4 is a cross-sectional view taken along the line II-II' of FIG. 3.

FIG. 4 is a cross-sectional view taken along the line II-II' of FIG. 3.

Referring to FIG. 4, the light emitting element layer EML of the display device may be disposed on the thin-film transistor layer TFTL and may include first through third insulating layers IL1 through IL3.

A plurality of first banks BNK1 may be disposed in each of the first through third light emitting areas LA1 through LA3. Each of the first banks BNK1 may correspond to the first electrode AE or the second electrode CE. Each of the first and second electrodes AE and CE may be disposed on a corresponding first bank BNK1.

The first banks BNK1 may be disposed on the first planarization layer OC1, and side surfaces of each of the first banks BNK1 may be inclined from (e.g., inclined with respect to) the first planarization layer OC1. The inclined surfaces of the first banks BNK1 may reflect light emitted from a light emitting element ED.

Referring to FIG. 4, in conjunction with FIG. 3, the first electrode stem part AE1 may have the first contact hole CNT1 passing through the first planarization layer OC1. The first electrode stem part AE1 may be electrically connected to a thin-film transistor TFT through the first contact hole CNT1.

The second electrode stem part CE1 may extend in the first direction X and may also be disposed in a non-light emitting area in which the light emitting element ED is not disposed. The second electrode stem part CE1 may have the second contact hole CNT2 passing through the first planarization layer OC1. The second electrode stem part CE1 may be electrically connected to a power electrode through the second contact hole CNT2. The second electrode CE may receive an electrical signal (e.g., a predetermined electrical signal) from the power electrode.

The first and second electrodes AE and CE may include a transparent conductive material. The first and second electrodes AE and CE may include a conductive material having high reflectivity. Each of the first and second electrodes AE and CE may have a structure in which a transparent conductive material and a metal having high reflectivity are each stacked in one or more layers, or they may be formed as a single layer including such materials.

The first insulating layer IL1 may be disposed on the first planarization layer OC1, the first electrode AE, and the second electrode CE. The first insulating layer IL1 may cover a part of each of the first and second electrodes AE and CE.

The first insulating layer IL1 may protect the first and second electrodes AE and CE and may insulate the first and second electrodes AE and CE from each other. The first insulating layer IL1 may prevent the light emitting element ED from directly contacting other members and, thus, being damaged.

The light emitting element ED may be disposed on the first and second insulating layers IL1 and IL2 between the first electrode AE and the second electrode CE. An end of the light emitting element ED may be connected to the first electrode AE, and another end (e.g., an opposite end) of the light emitting element ED may be connected to the second electrode CE.

The third insulating layer IL3 may be disposed on a part of the light emitting element ED between the first and second electrodes AE and CE. The third insulating layer IL3 may partially cover an outer surface of the light emitting element ED. The third insulating layer IL3 may protect the light emitting element ED.

The contact electrodes CTE may include the first and second contact electrodes CTE1 and CTE2. The first contact electrode CTE1 may cover a first electrode branch part AE2 and a part of the light emitting element ED and may electrically connect the first electrode branch part AE2 and the light emitting element ED. The second contact electrode CTE2 may cover the second electrode branch part CE2 and another part of the light emitting element ED and may electrically connect the second electrode branch part CE2 and the light emitting element ED.

The first contact electrode CTE1 may be disposed on the first electrode branch part AE2 to extend in the second direction Y. The first contact electrode CTE1 may contact an end of the light emitting element ED. The light emitting element ED may be electrically connected to the first electrode AE through the first contact electrode CTE1.

The second contact electrode CTE2 may be disposed on the second electrode branch part CE2 to extend in the second direction Y. The second contact electrode CTE2 may be spaced apart from the first contact electrode CTE1 in the first direction X. The second contact electrode CTE2 may contact the other end of the light emitting element ED. The light emitting element ED may be electrically connected to the second electrode CE through the second contact electrode CTE2.

The contact electrodes CTE may include a conductive material.

Figure 5:
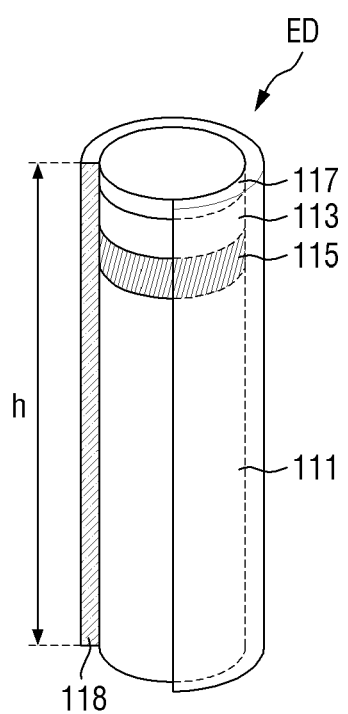
FIG. 5 illustrates a light emitting element according to an embodiment.

FIG. 5 illustrates a light emitting element ED according to an embodiment.

Referring to FIG. 5, the light emitting element ED may be a light emitting diode. For example, the light emitting element ED may be an inorganic light emitting diode having a size of micrometers or nanometers and made of an inorganic material. The inorganic light emitting diode may be aligned between two electrodes facing each other according to an electric field formed in a specific direction between the two electrodes.

The light emitting element ED may extend in one direction. The light emitting element ED may have a shape like a rod, a wire, a tube, or the like. The light emitting element ED may include a first semiconductor layer 111, a second semiconductor layer 113, an active layer 115, an electrode layer 117, and an insulating film 118.

The first semiconductor layer 111 may be an n-type semiconductor. The second semiconductor layer 113 may be disposed on the active layer 115. Each of the first and second semiconductor layers 111 and 113 may be formed as a single layer, but the present disclosure is not limited thereto.

The active layer 115 may be disposed between the first and second semiconductor layers 111 and 113. The active layer 115 may include a material having a single or multiple quantum well structure. When the active layer 115 includes a material having a multiple quantum well structure, it may have a structure in which a plurality of quantum layers and a plurality of well layers are alternately stacked.

Light emitted from the active layer 115 may be radiated not only in a longitudinal direction of the light emitting element ED but also toward both side surfaces of the light emitting element LD. The direction of light emitted from the active layer 115 may not be limited.

The electrode layer 117 may be an ohmic contact electrode. In other embodiments, the electrode layer 117 may be a Schottky contact electrode. The light emitting element ED may include at least one electrode layer 117.

The insulating film 118 may surround (e.g., may cover) outer surfaces of the semiconductor layers and the electrode layers. The insulating film 118 may surround an outer surface of the active layer 115 and extend in the direction in which the light emitting element ED extends. The insulating film 118 may protect the light emitting element ED.

The insulating film 118 may include a material having insulating properties, such as silicon oxide ($SiO_x$), silicon nitride ($SiN_x$), silicon oxynitride ($SiO_xN_y$), aluminum nitride (AlN), or aluminum oxide ($Al_2O_3$).

An outer surface of the insulating film 118 may be treated. When the display device is manufactured, the light emitting element ED may be sprayed onto electrodes while being dispersed in an ink and may then be aligned.

Figure 6:
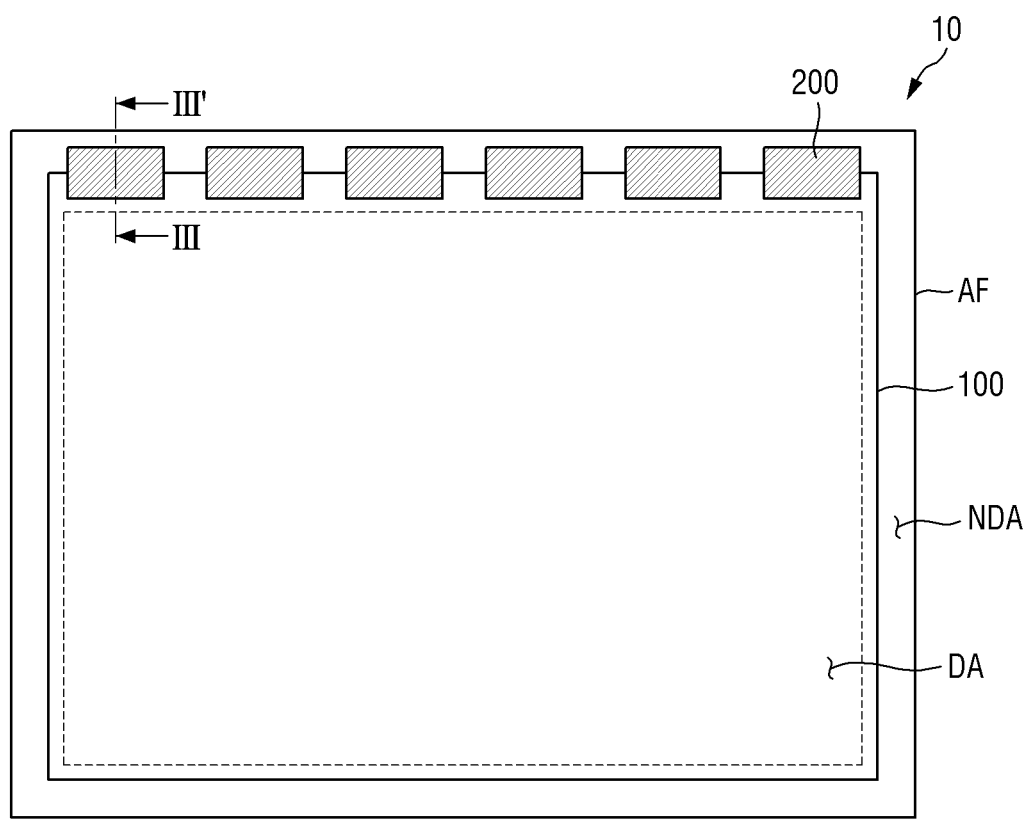
FIG. 6 is a plan view illustrating the display device of FIG. 1 in more detail.
Figure 7:
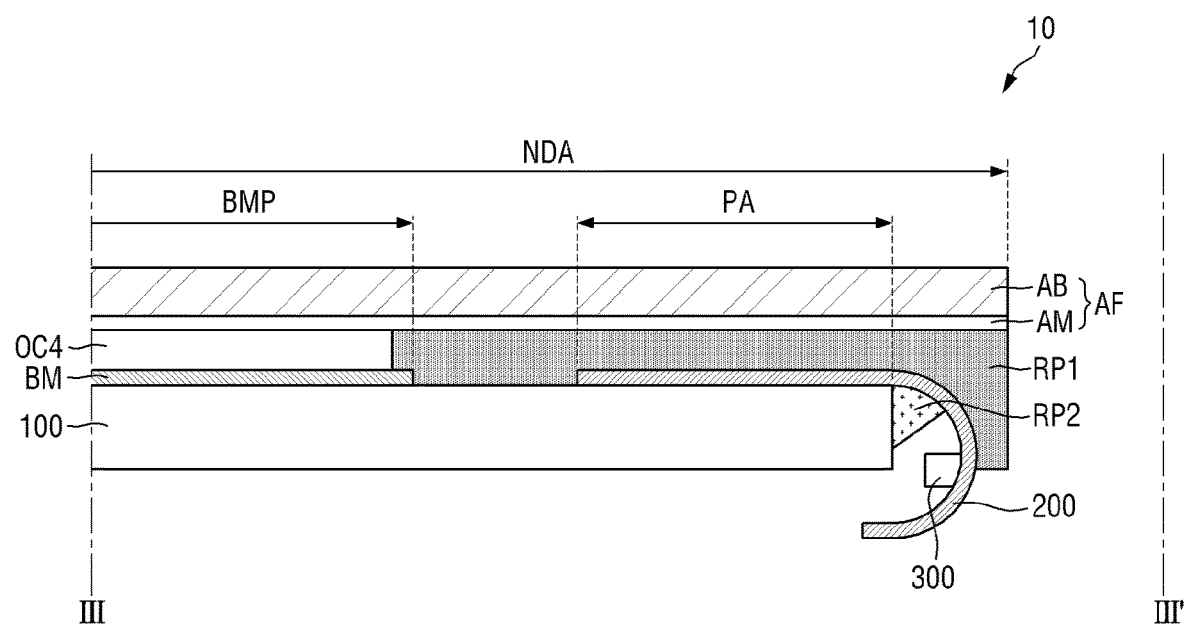
FIG. 7 is a cross-sectional view taken along the line III-III' of FIG. 6.

FIG. 6 is a plan view illustrating the display device shown in FIG. 1 in more detail. FIG. 7 is a cross-sectional view taken along the line III-III' of FIG. 6.

Referring to FIGS. 6 and 7, the display device may further include a printed circuit film 200. The substrate 100 may have, for example, a rectangular shape. The substrate 100 may have long sides extending along the first direction X and short sides extending along the second direction Y. However, the planar shape of the substrate 100 is not limited thereto and may be a square shape, a circular shape, an oval shape, or other polygonal shapes.

The anti-reflection film AF may be disposed on the substrate 100. The planar shape of the anti-reflection film AF may be substantially the same as the planar shape of the substrate 100. For example, the anti-reflection film AF may have long sides extending along the first direction X and short sides extending along the second direction Y. However, the planar shape of the anti-reflection film AF is not limited thereto and may be a square shape, a circular shape, an oval shape, or other polygonal shapes.

The printed circuit film 200 may be attached to an end of the substrate 100 on a second side in the second direction Y. The printed circuit film 200 may be provided in plural numbers (e.g., a plurality of printed circuit films 200 may be provided). The printed circuit films 200 may be spaced apart from each other along the first direction X.

The anti-reflection film AF may overlap the substrate 100 and the printed circuit films 200 in a plan view. The anti-reflection film AF may completely cover the substrate 100 and the printed circuit films 200 in a plan view. The planar area of the anti-reflection film AF may be larger than the planar area of the substrate 100. In FIG. 6, the anti-reflection film AF is shown as protruding further outwardly than (e.g., protruding or extending beyond) ends of the substrate 100 on a first side and a second side in the first direction X and ends of the substrate 100 on a first side and the second side in the second direction Y. However, the present disclosure is not limited thereto, and the anti-reflection film AF may be aligned with the substrate 100 at the ends of the substrate 100 on the first side and the second side in the first direction X and may protrude further outwardly than the ends of the substrate 100 on the first side and the second side in the second direction Y. In some embodiments, the anti-reflection film AF may be aligned with the substrate 100 at the ends of the substrate 100 on the first side and the second side in the first direction X and at the end of the substrate 100 on the second side in the second direction Y and may protrude further outwardly than the end of the substrate 100 on the first side in the second direction Y. In some embodiments, the anti-reflection film AF may be omitted and a polarizing layer may be provided in its place.

Referring to FIG. 7, the display device 10 may further include a first resin RP1 and a second resin RP2. The display device 10 may further include a driver chip 300 disposed on a printed circuit film 200.

The non-display area NDA may include a light blocking pattern area BMP in which a light blocking pattern BM is disposed and a pad area PA which is an area of the substrate 100 to which the printed circuit film 200 is attached. The fourth planarization layer OC4 may be disposed on the light blocking pattern BM in the light blocking pattern area BMP. The fourth planarization layer OC4 may expose an end of the light blocking pattern BM (e.g., an end in a direction from the light blocking pattern area BMP to the pad area PA). The first resin RP1 may be disposed on the exposed end of the light blocking pattern BM (e.g., the end in the direction from the light blocking pattern area BMP to the pad area PA) and the printed circuit film 200. The first resin RP1 may directly contact the exposed end of the light blocking pattern BM (e.g., the end in the direction from the light blocking pattern area BMP to the pad area PA) and the printed circuit film 200. Although a surface height of the fourth planarization layer OC4 and a surface height of the first resin RP1 are illustrated as being the same, the present disclosure is not limited thereto.

The first resin RP1 may completely cover the printed circuit film 200 that is bent in the thickness direction. The first resin RP1 may protrude further outside the printed circuit film 200 that is bent in the thickness direction. The first resin RP1 may be a light blocking layer. The first resin RP may include a black resin as a light blocking layer. The first resin RP1, including the black resin, may cover the exposed end of the light blocking pattern BM (e.g., the end in the direction from the light blocking pattern area BMP to the pad area PA) as described above. For example, the first resin RP1 may overlap the light blocking pattern area BMP, thereby preventing the printed circuit film 200 from being visible in the non-display area NDA.

The second resin RP2 may be disposed between the bent printed circuit film 200 and the substrate 100. The second resin RP2 disposed between the bent printed circuit film 200 and the substrate 100 may improve adhesion between the printed circuit film 200 and the substrate 100. The second resin RP2 may include a transparent resin. However, the present disclosure is not limited thereto, and the second resin RP2 may also include a black resin or an opaque resin.

The anti-reflection film AF may be disposed on the fourth planarization layer OC4 and the first resin RP1. The first base AB may be attached to the fourth planarization layer OC4 and the first resin RP1 through the first bonding layer AM of the anti-reflection film AF.

An end (or a side surface) of the anti-reflection film AF may be aligned with an end (or a side surface) of the first resin RP1 in the thickness direction. This may be formed by an anti-reflection film AF' and a first resin RP1' being concurrently (or simultaneously) cut after being formed, as will be described later with reference to FIGS. 10 and 11.

Next, a method of manufacturing a display device according to an embodiment will be described.

FIGS. 8 through 11 are cross-sectional views illustrating steps of a method of manufacturing a display device according to an embodiment.

Figure 8:
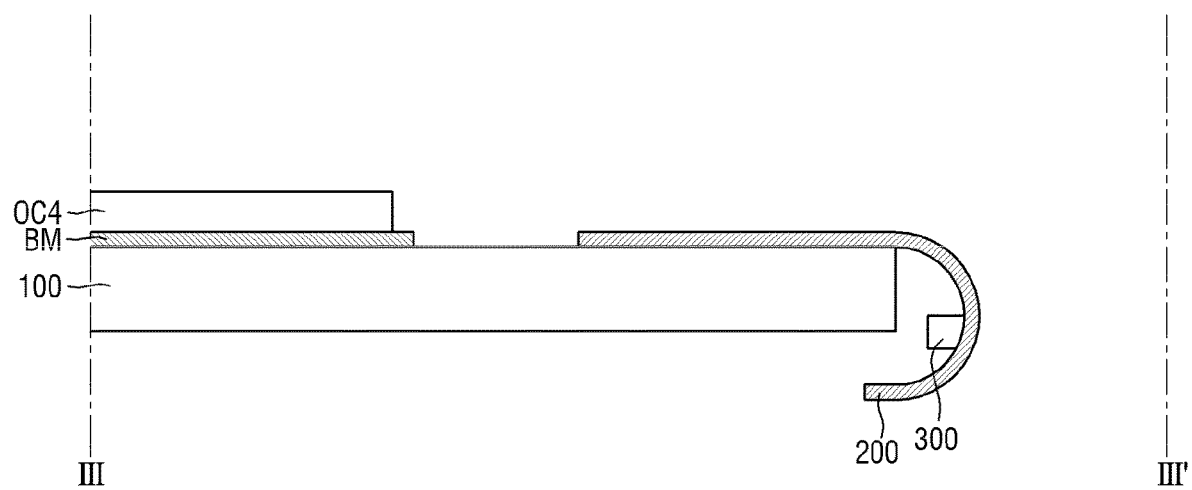
FIGS. 8 through 11 are cross-sectional views illustrating steps of a method of manufacturing a display device according to an embodiment.

First, referring to FIG. 8, a light blocking pattern BM and a printed circuit film 200 are disposed on a substrate 100, and then, a fourth planarization layer OC4 is formed on the light blocking pattern BM. The fourth planarization layer OC4 may be disposed to expose an end of the light blocking pattern BM.

Figure 9:
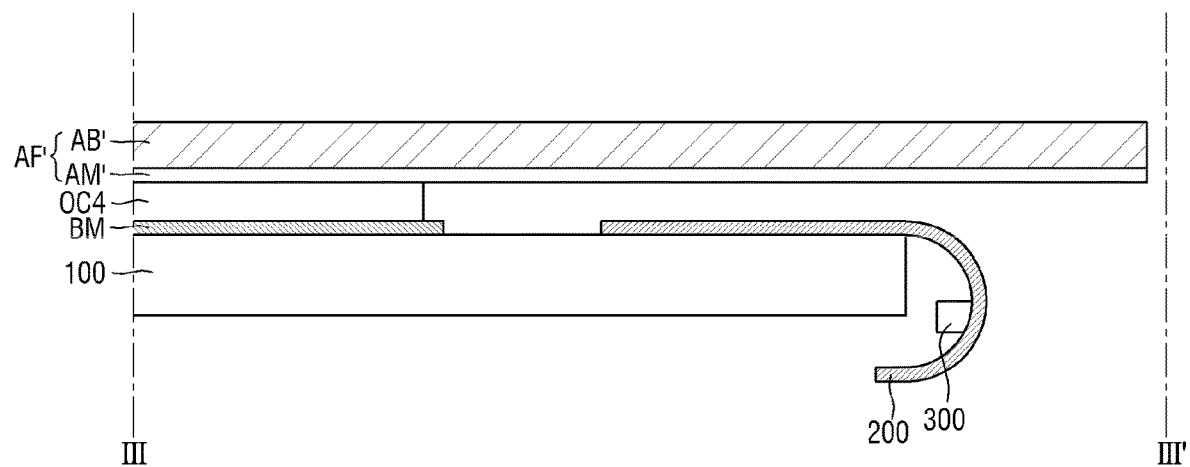

Next, referring to FIG. 9, an anti-reflection film AF' is disposed on the fourth planarization layer OC4. The anti-reflection film AF' includes a first base AB' and a first bonding layer AM'. The anti-reflection film AF' may protrude outside the bent printed circuit film 200.

Figure 10:
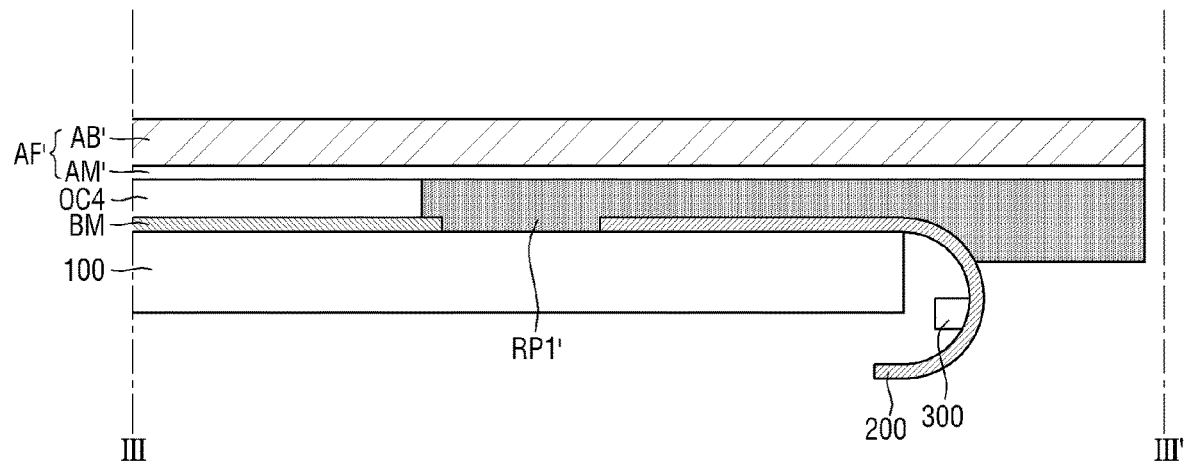

Next, referring to FIG. 10, a first resin RP1' is formed between the anti-reflection film AF' and the printed circuit film 200. The first resin RP1' may be formed to contact the end of the light blocking pattern BM exposed by the fourth planarization layer OC4 and side surfaces of the printed circuit film 200 and the fourth planarization layer OC4. Similar to the anti-reflection film AF', the first resin RP' may also protrude outside the bent printed circuit film 200. Although side surfaces of the first resin RP1' and the anti-reflection film AF' are shown as being aligned in FIG. 11, the present disclosure is not limited thereto.

Figure 11:
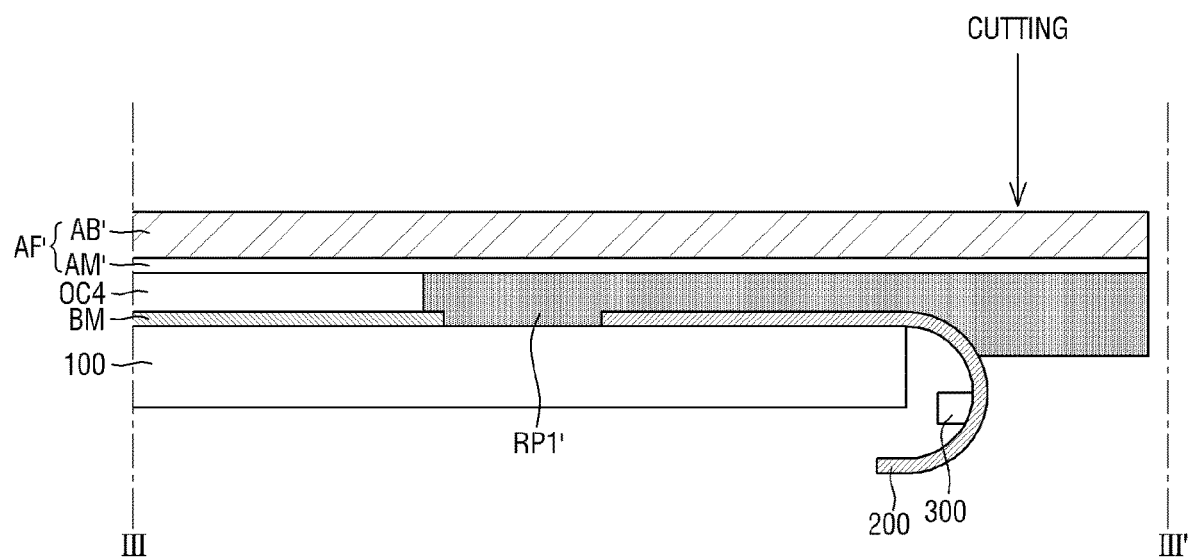

Next, referring to FIG. 11, the anti-reflection film AF' and the first resin RP1' may be concurrently (or simultaneously) cut. Accordingly, the display device illustrated in FIG. 7 may be manufactured.

Figure 12:
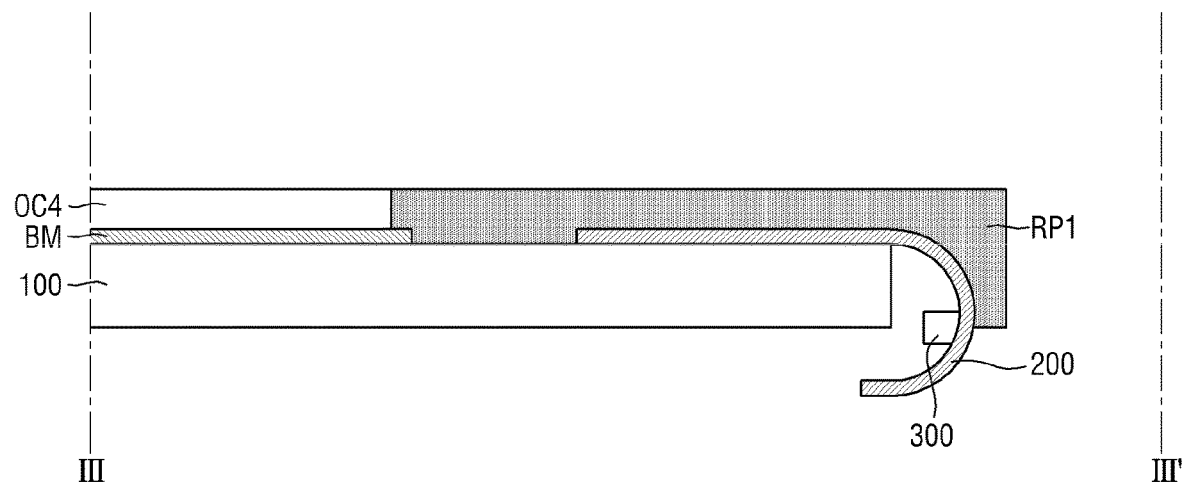
FIGS. 12 through 14 are cross-sectional views illustrating steps of a method of manufacturing a display device according to an embodiment.
Figure 13:
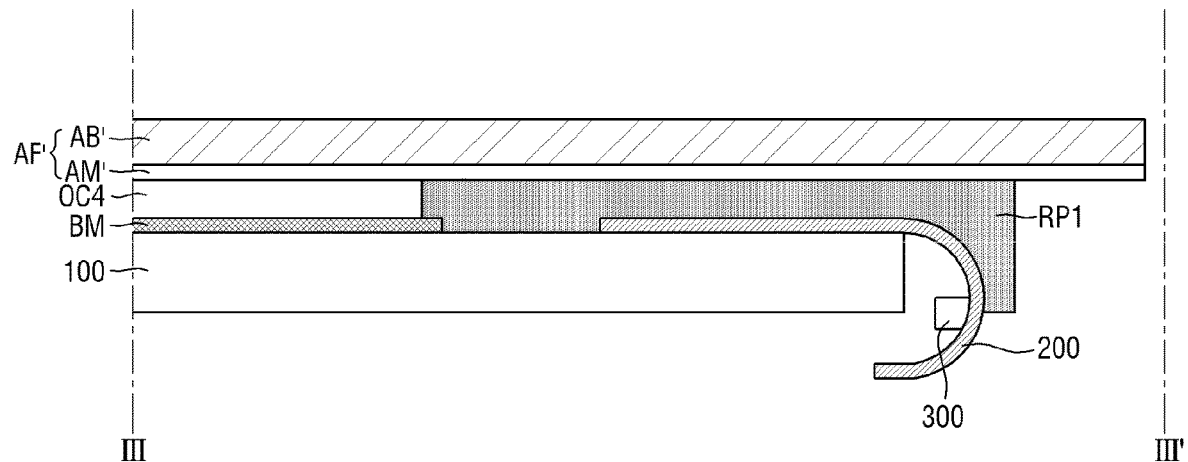
Figure 14:
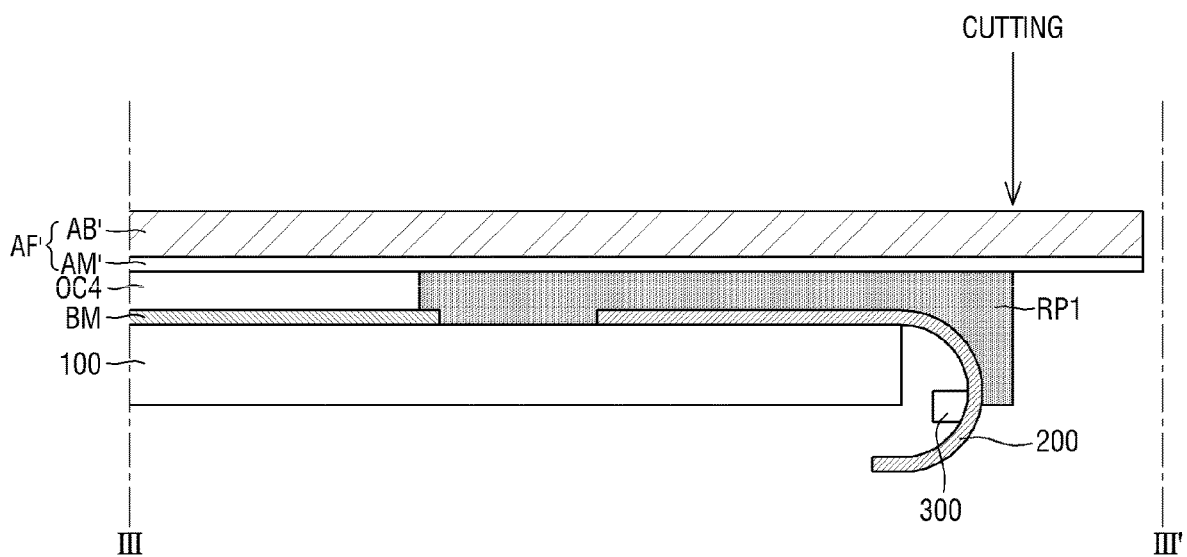

FIGS. 12 through 14 are cross-sectional views illustrating steps of the method of manufacturing a display device according to an embodiment.

First, referring to FIG. 12, a first resin RP1 is formed before an anti-reflection film AF' is disposed, different from the embodiment described with respect to FIGS. 9 and 10.

Then, referring to FIG. 13, the anti-reflection film AF' is disposed on the first resin RP1 and a fourth planarization layer OC4. The anti-reflection film AF' may protrude further outwardly than the first resin RP1.

Next, referring to FIG. 14, the anti-reflection film AF' is cut.

In some embodiments, even when the first resin RP1 is formed before the anti-reflection film AF', it may also be cut in the process of cutting the anti-reflection film AF'.

Figure 15:
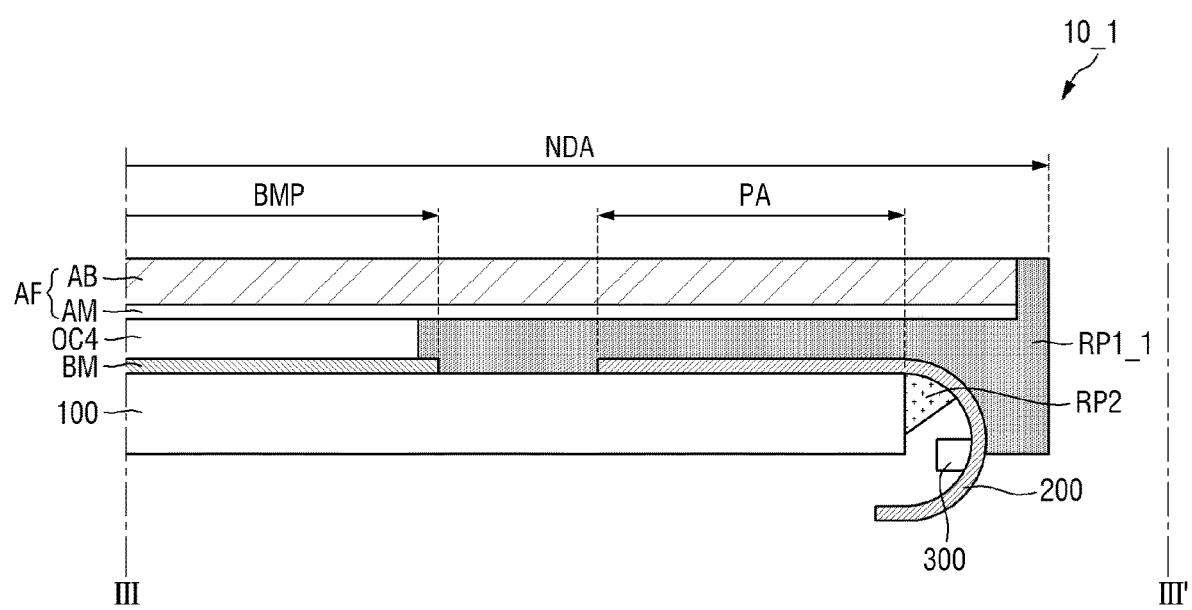
FIG. 15 is a cross-sectional view of a display device according to an embodiment.

FIG. 15 is a cross-sectional view of a display device 10_1 according to an embodiment.

Referring to FIG. 15, the display device 10_1 is different from the display device 10 shown in FIG. 7 in that a first resin RP1_1 directly contacts a side surface of an anti-reflection film AF.

For example, the first resin RP1_1 may directly contact side surfaces of a first base AB and a first bonding layer AM of the anti-reflection film AF. That is, the first resin RP1_1 may protrude further outwardly than the anti-reflection film AF. Accordingly, the first resin RP1_1 may protect a side surface of the anti-reflection film AF.

Figure 16:
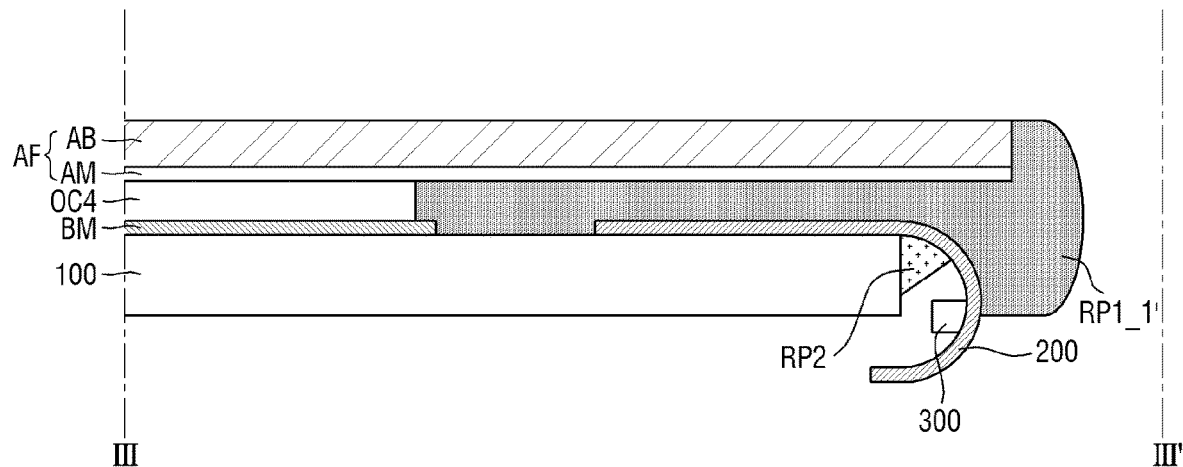
FIGS. 16 and 17 are cross-sectional views illustrating a method of manufacturing the display device shown in FIG. 15.
Figure 17:
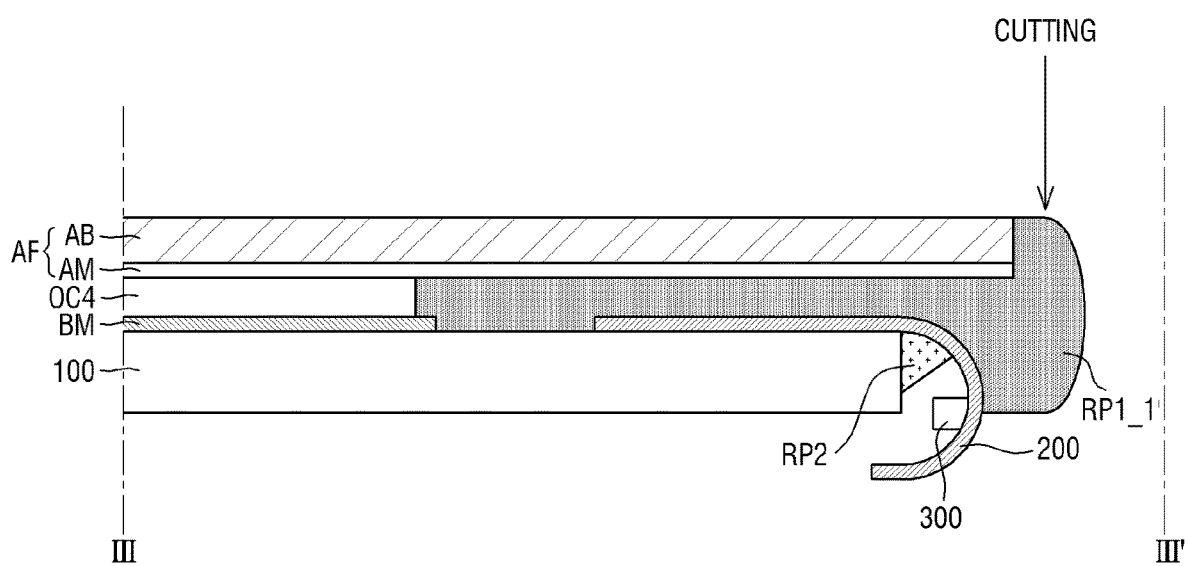

FIGS. 16 and 17 are cross-sectional views illustrating steps of a method of manufacturing the display device shown in FIG. 15.

First, referring to FIG. 16, after an anti-reflection film AF is disposed on a fourth planarization layer OC4, a first resin RP1_1' is formed. The first resin RP1_1' may be formed to directly contact a side surface of the anti-reflection film AF. The first resin RP1_1' may include a black resin.

Next, referring to FIG. 17, the first resin RP1_1' is cut to manufacture the display device 10_1 as illustrated in FIG. 15.

Figure 18:
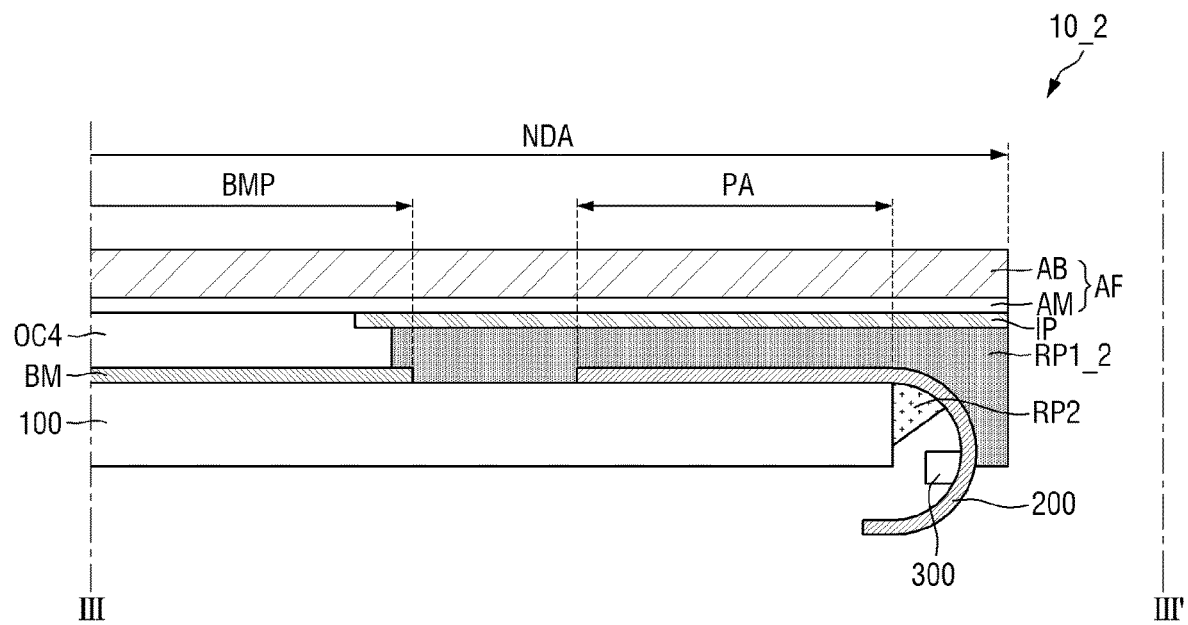
FIG. 18 is a cross-sectional view of a display device according to an embodiment.

FIG. 18 is a cross-sectional view of a display device 10_2 according to an embodiment.

Referring to FIG. 18, the display device 10_2 is different from the display device 10 shown in FIG. 7 in that it further includes a black printed layer IP between a first resin layer RP1_2 and an anti-reflection film AF. The black printed layer IP may be a light blocking layer.

The black printed layer IP may overlap an end of a light blocking pattern BM. For example, the black printed layer IP may overlap a part of a light blocking pattern area BMP. In the light blocking pattern area BMP in which the block printed layer IP is disposed, a fourth planarization layer OC4 may be spaced apart from the anti-reflection film AF with the black printed layer IP interposed between them.

In the embodiment illustrated in FIG. 18, because the black printed layer IP overlaps an end of the light blocking pattern BM, the printed circuit film 200 is not visible in a non-display area NDA. Further, because the black printing layer IP acts as a light blocking layer, the first resin RP1_2 does not need to include a black resin but may include a transparent resin. However, the present disclosure is not limited thereto.

Figure 19:
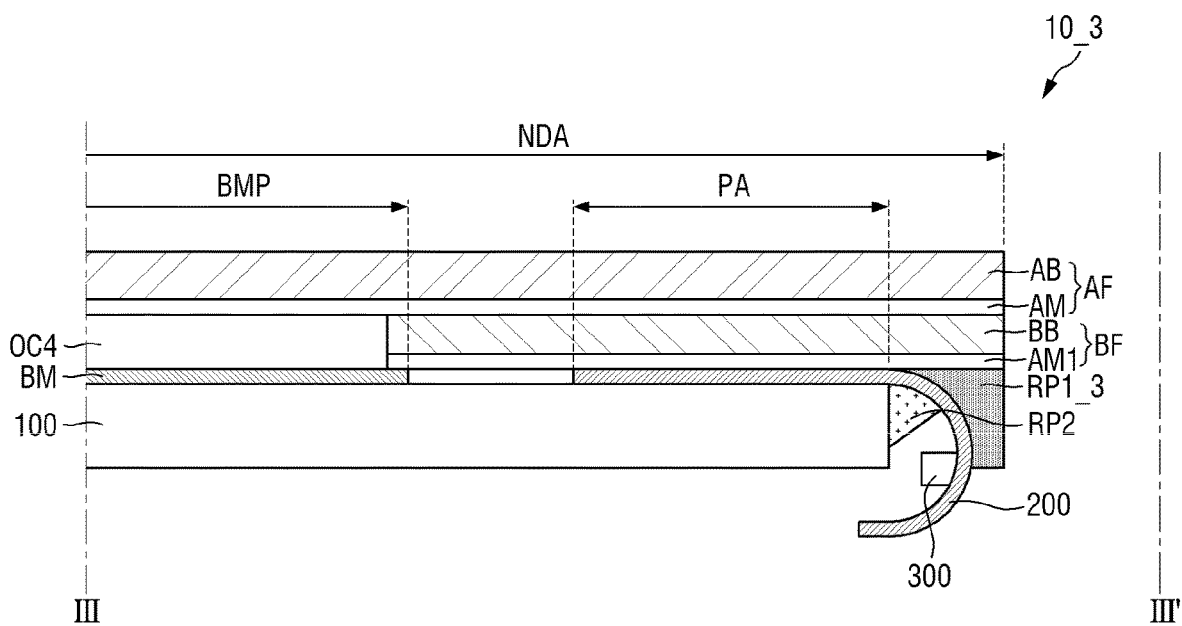
FIG. 19 is a cross-sectional view of a display device according to an embodiment.

FIG. 19 is a cross-sectional view of a display device 10_3 according to an embodiment.

Referring to FIG. 19, the display device 10_3 is different from the display device 10 shown in FIG. 7 in that a light blocking film BF is disposed on a printed circuit film 200.

The light blocking film BF may include a second base BB and a second bonding layer AM1. The second base BB may be attached to an end of a light blocking pattern BM, the printed circuit film 200, and a first resin RP1_3 through the second bonding layer AM1. The light blocking film BF may be a light blocking layer.

The light blocking film BF may overlap an end of the light blocking pattern BM. For example, the light blocking film BF may overlap a part of a light blocking pattern area BMP.

In the embodiment shown in FIG. 19, because the light blocking film BF overlaps an end of the light blocking pattern BM, the printed circuit film 200 is not visible in a non-display area NDA. Further, because the light blocking film BF act as a light blocking layer, the first resin RP1_3 does not need to include a black resin but may include a transparent resin. However, the present disclosure is not limited thereto.

The first resin layer RP1_3 may not overlap an upper surface of the substrate 100 as illustrated in FIG. 19.

In a display device and a method of manufacturing the same according to embodiments, visibility of a step difference in a pad area can be reduced.

However, the aspects and features of the present disclosure are not limits to those set forth herein. The above and other aspects and features of the present disclosure will become more apparent to one of ordinary skill in the art to which the present disclosure pertains by referencing the claims.

What is claimed is:

1. A display device having a display area with a plurality of light emitting areas and a non-light emitting area between the light emitting areas and a non-display area around a periphery of the display area, the display device comprising:
    a base substrate having a first surface and a second surface opposite the first surface;
    a light emitting element in each of the light emitting areas on the first surface of the base substrate;
    a light blocking pattern in the non-light emitting area on the light emitting element and in a light blocking area of the non-display area;
    a printed circuit film attached to a pad area of the non-display area on the first surface of the base substrate; and
    a light blocking layer on the light blocking pattern and the printed circuit film,
    wherein the pad area is nearer to an end of the base substrate than the light blocking area is, and
    wherein the light blocking layer comprises a black resin and overlaps the light blocking pattern.

2. The display device of claim 1, wherein a first end of the printed circuit film is attached to the first surface of the base substrate, wherein the printed circuit film is bent so that a second end of the printed circuit film is on the second surface of the base substrate, and wherein a driver chip is on the printed circuit film.

3. The display device of claim 2, wherein the light blocking layer directly contacts an upper surface of the printed circuit film.

4. The display device of claim 3, wherein the light blocking layer protrudes further outwardly than the printed circuit film.

5. The display device of claim 4, further comprising an external light reflection preventing layer on the light blocking layer, wherein a planar area of the external light reflection preventing layer is larger than that of the base substrate.

6. The display device of claim 5, wherein the external light reflection preventing layer protrudes further outwardly than an end of the base substrate.

7. The display device of claim 6, wherein a side surface of the external light reflection preventing layer is aligned with a side surface of the light blocking layer in a thickness direction.

8. The display device of claim 6, wherein the light blocking layer contacts a side surface of the external light reflection preventing layer.

9. The display device of claim 5, further comprising a planarization layer on the light blocking pattern, wherein the planarization layer exposes an end of the light blocking pattern, and wherein the light blocking layer directly contacts the exposed end of the light blocking pattern.

10. The display device of claim 9, wherein the light blocking layer directly contacts the planarization layer.

11. The display device of claim 10, wherein the external light reflection preventing layer comprises a first base and a first bonding layer, and wherein the first base is bonded to the planarization layer and the light blocking layer through the first bonding layer.

12. The display device of claim 2, further comprising a resin layer between a side surface of the base substrate and the printed circuit film, wherein the resin layer comprises a transparent resin.

13. A display device having a display area with a plurality of light emitting areas and a non-light emitting area between the light emitting areas and a non-display area around a periphery of the display area, the display device comprising:

a base substrate having a first surface;

a light emitting element in each of the light emitting areas on the first surface of the base substrate;

a light blocking pattern in the non-light emitting area on the light emitting element and in a light blocking area of the non-display area;

a printed circuit film attached to a pad area of the non-display area on the first surface of the base substrate;

a resin layer on the light blocking pattern and the printed circuit film; and a light blocking layer on the resin layer, wherein the pad area is nearer to an end of the base substrate than the light blocking area is, and wherein the light blocking layer overlaps the light blocking pattern.

14. The display device of claim 13, wherein the resin layer comprises a transparent resin.

15. The display device of claim 14, wherein the light blocking layer protrudes further outwardly than the printed circuit film, and wherein a side surface of a black printed layer and a side surface of the light blocking layer are aligned with each other in a thickness direction.

16. The display device of claim 15, wherein the light blocking layer comprises a black printed layer.

17. The display device of claim 15, wherein the light blocking layer comprises a black film.

18. A method of manufacturing a display device having a display area with a plurality of light emitting areas and a non-light emitting area between the light emitting areas and a non-display area around a periphery of the display area, the method comprising:

forming a light emitting element in each of the light emitting areas on a first surface of a base substrate;

forming a light blocking pattern in the non-light emitting area on the light emitting element and in a light blocking area of the non-display area;

attaching a printed circuit film to a pad area of the non-display area on the first surface of the base substrate; and forming a light blocking layer and an external light reflection preventing layer on the light blocking pattern and the printed circuit film, wherein the pad area is nearer to an end of the base substrate than the light blocking area is, and wherein the light blocking layer is between the printed circuit film and the external light reflection preventing layer, comprises a black resin, and overlaps the light blocking pattern.

19. The method of claim 18, wherein, in the forming of the light blocking layer and the external light reflection preventing layer, the light blocking layer is formed after the external light reflection preventing layer is formed.

20. The method of claim 19, wherein, when the light blocking layer is formed after the external light reflection preventing layer is formed, an end of the external light reflection preventing layer and an end of the light blocking layer are concurrently cut.

* * * * *